(12) United States Patent
Brown et al.

(10) Patent No.: US 8,182,103 B1
(45) Date of Patent: *May 22, 2012

(54) MODULAR MMW POWER SOURCE

(75) Inventors: Kenneth W. Brown, Yucaipa, CA (US);
Andrew Kent Brown, Victorville, CA (US);
William Earl Dolash, Montclair, CA (US);
Darin Michael Gritters, Calimesa, CA (US);
Thomas Lee Obert, Claremont, CA (US);
Michael John Sotelo, Chino, CA (US)

(73) Assignee: Raytheon Company, Waltham, MA (US)

( * ) Notice: Subject to any disclaimer, the term of this patent is extended or adjusted under 35 U.S.C. 154(b) by 1286 days.

This patent is subject to a terminal disclaimer.

(21) Appl. No.: 11/841,580

(22) Filed: Aug. 20, 2007

(51) Int. Cl.
*G02B 5/08* (2006.01)

(52) U.S. Cl. ........................................ 359/849

(58) Field of Classification Search .................. 359/849; 455/103
See application file for complete search history.

(56) References Cited

U.S. PATENT DOCUMENTS

| | | |
|---|---|---|
| 3,818,386 A | 6/1974 | Granberry |
| 5,086,304 A | 2/1992 | Collins |
| 5,162,803 A | 11/1992 | Chen |
| 5,481,223 A | 1/1996 | Wong |
| 5,488,380 A | 1/1996 | Harvey et al. |
| 5,515,009 A | 5/1996 | Wong |
| 5,736,908 A | 4/1998 | Alexanian |
| 5,920,240 A | 7/1999 | Alexanian |
| 6,130,640 A | 10/2000 | Uematsu |
| 6,239,764 B1 | 5/2001 | Timofeev et al. |
| 6,421,021 B1 | 7/2002 | Rupp et al. |
| 6,542,662 B2 | 4/2003 | Cheung |
| 6,559,724 B2 | 5/2003 | Rosenberg |
| 6,765,535 B1 | 7/2004 | Brown |
| 6,777,684 B1 * | 8/2004 | Volkov et al. .............. 250/341.1 |
| 6,876,272 B2 | 5/2005 | DeLisio, Jr. |
| 7,215,220 B1 | 5/2007 | Jai |

(Continued)

FOREIGN PATENT DOCUMENTS

EP       0 653 801       5/1995

(Continued)

OTHER PUBLICATIONS

Mailloux, Robert J. "Antenna Array Architecture," 8078 Proceedings of the IEEE, 1992, vol. 80, No. 1, New York, US, Jan. 1992.

(Continued)

*Primary Examiner* — Euncha Cherry

(57) ABSTRACT

A millimeter wave power source module may include N submodules, each of which includes M circuit devices, where M and N are greater than one. Each circuit device may have an output connected to a corresponding radiating element. Each submodule may include a power divider having K input ports and M output ports, where K is a factor of M. Each input port may be coupled to a corresponding receiving element, and each output port may be coupled to an input of a corresponding circuit device. Each submodule may include a heat spreader for removing heat from the circuit devices. The power source module may include a combination RF feed network and heat sink. The combination RF feed network and heat sink may include a wavefront expander to expand the RF input wavefront along at least one axis, and to direct the expanded wavefront to the receiving elements of the N submodules. The combination RF feed network and heat sink may also include a heat exchanger thermally coupled to the heat spreaders of the N submodules.

20 Claims, 8 Drawing Sheets

U.S. PATENT DOCUMENTS 7,391,382 B1   6/2008   Mason et al.
2006/0202777 A1   9/2006   Deckman

FOREIGN PATENT DOCUMENTS

| | | |
|---|---|---|
| EP | 0 448 318 | 5/1996 |
| EP | 1 301 966 | 4/2003 |
| EP | 1 151 317 | 3/2005 |
| GB | 2 225 170 | 5/1990 |

OTHER PUBLICATIONS

Delisio, Quasi optical and spatial power combining, Mar. 2002.
Harvey, Spatial power combining for high power amplifiers, Dec. 2000.
Jai, Design of waveguide finline arrays for spatial power combining, Apr. 2001.
Sowers, A 36 Watt, V-band, Solid State Source. 1999.

\* cited by examiner

MODULAR MMW POWER SOURCE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent application is related to a copending application, U.S. application Ser. No. 12/237,312, entitled "Lens Array Module."

BACKGROUND

1. Field

This disclosure relates to sources for millimeter wave (MMW) RF power, and to high power sources for W-band applications in particular.

2. Description of the Related Art

Sources of medium and high power MMW radiation can be applied in communications systems and in directed energy weapons. While lower frequency MMW wave application can now be satisfied with solid-state sources, high power sources for the W-band (75 MHz to 110 MHz) traditionally incorporate tubes such as magnetrons or gyrotrons. However, such tubes are expensive, bulky, fragile, and require high voltage electrical power. Thus MMW sources incorporating tubes are not readily portable.

Semiconductor devices are now available for use as oscillators or amplifiers in the W-band, but the available power output from each semiconductor device may be limited to no more than a few watts. Thus medium and high power solid state W-band sources may use quasi-optical methods that combine the power output from a large plurality of semiconductor devices within a waveguide or in free space. Approaches that have been suggested for combining the power output from plural semiconductor devices include the reflect array amplifier described in U.S. Pat. No. 6,765,535, the grid array amplifier described in U.S. Pat. No. 6,559,734, and the lens array or tray amplifier described in U.S. Pat. No. 5,736,908.

DETAILED DESCRIPTION

Throughout this description, the embodiments and examples shown should be considered as exemplars, rather than limitations on the apparatus and methods disclosed or claimed.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DESCRIPTION OF APPARATUS

Figure 1:
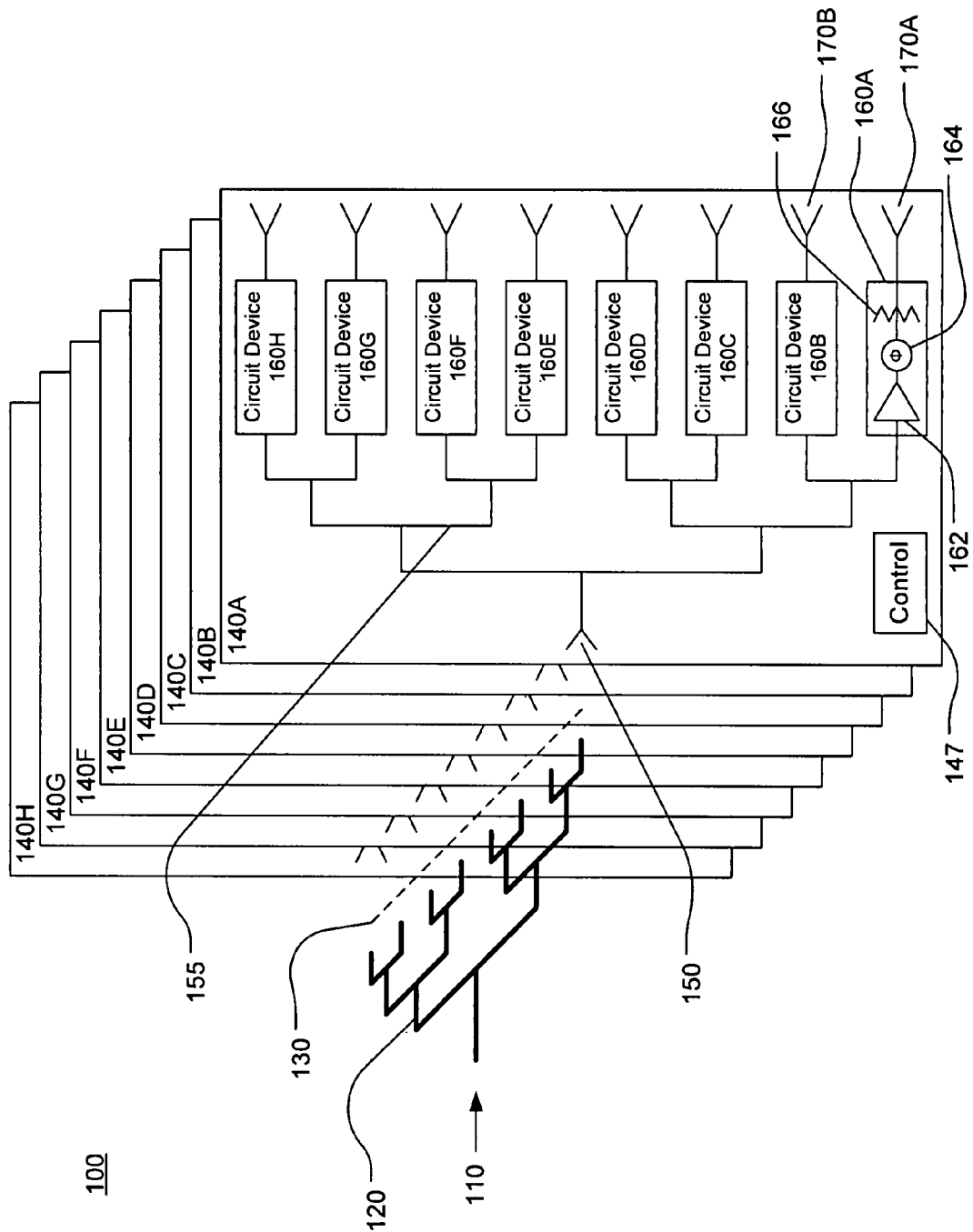
FIG. 1 is a block diagram of a power source module.

Referring now to the block diagram of FIG. 1, an exemplary power source module 100 may include a plurality of submodules 140A-H. The submodules 140A-H may or may not be identical. While eight submodules 140A-H are shown in this example, the power source module 100 may include N submodules, where N is an integer greater than one. The number of submodules may be a power of two. Each submodule 140A-H may be comprised of a generally planar substrate supporting a plurality of circuit devices 160A-H. While eight circuit devices 160A-H are shown on submodule 140A in this example, each submodule 140A-H may include M circuit devices 160, where M is an integer greater than one. The number of circuit devices per submodule may be a power of two. The number of circuit devices per submodule may be less than, equal to, or greater than the number of submodules.

Each circuit device 160A-H may include one or more of an amplitude adjuster 166, a phase shifter 164 and an amplifier 163. Each circuit device 160A-H may include one or more of an RF switch, a circulator, and a low noise amplifier (none of which are shown in FIG. 1) in which case the power source module 100 may have a capability to function as a receiver as well as a power source. The amplitude adjuster 166 may be a variable attenuator, a variable gain amplifier stage within or in addition to amplifier 163, or some other gain adjusting device. The amplitude adjuster 166, the phase shifter 164 and the amplifier 163, may be separate devices or components, or may be completed or partially implemented in one or more monolithic microwave integrated circuits. The circuit devices 160A-H on any submodule 140A-H may be identical or may be different.

Each submodule may also include other circuitry represented by control circuitry 147. Control circuitry 147 may provide signals to control phase shifters and/or amplitude adjusters within circuit devices 160A-H. Control circuitry 147 may include a microcontroller or other processor to receive instructions from external to the power source module and to generate the control signals.

Each circuit device 160A-H may have an input coupled to a power divider 155 and an output coupled to a radiating element. For example, the output of circuit element 160A may be coupled to radiating element 170A. Radiating element 170A may be a flared notch antenna, a tapered slot antenna, a Vivaldi antenna, a dipole antenna, a Yagi-uda antenna or any other end-fire antenna element.

The power source module 100 may include a wavefront expander 120 to accept an MMW input wavefront 110 and to provide an expanded MMW wavefront 130. The MMW input wavefront 110 may be coupled from a waveguide or other transmission medium. The wavefront expander 120, represented in the block diagram of FIG. 1 as a 8:1 power divider, may include a parallel-plate horn, a waveguide power divider or other power divider, lenses, curved or flat reflectors, and combinations of these and other elements. The expanded MMW wavefront 130 may be a plane wave or other wavefront.

The expanded MMW wavefront 130 may be coupled to a receiving element 150 on each of the submodules 140A-H. Each receiving element may convert a portion of the energy of expanded MMW wavefront 130 into a signal coupled to the input of the power divider 155. The power divider 155 may be a stripline power divider or other power divider. The power divider 155 may have M outputs, where M is the number of circuit devices 160A-H on a submodule. M is equal to eight in the example of FIG. 1, but M may be less than or greater than eight. Each of the M power divider outputs may be coupled to the input of a corresponding circuit device. Each circuit device may amplify or otherwise modify the input signal from the corresponding power divider output and provide an output signal to the corresponding radiating element.

For example, receiving element 150 may provide an input signal power divider 155, which provides a divided signal to the input of circuit device 160A. Circuit device 160A may, in turn, provide an output signal to radiating element 170A. Each radiating element may convert the output signal from the corresponding circuit element into a radiated wavefront (not shown). The radiated wavefronts from the plurality of radiating elements on the plurality of submodules may be spatially combined to provide an output wavefront (not shown) that differs from the expanded wavefront 130 in amplitude, direction, or some other property. The spatially combined output wavefront may be radiated into free space or coupled into an output waveguide (not shown), a waveguide horn (not shown), or another device.

Figure 2:
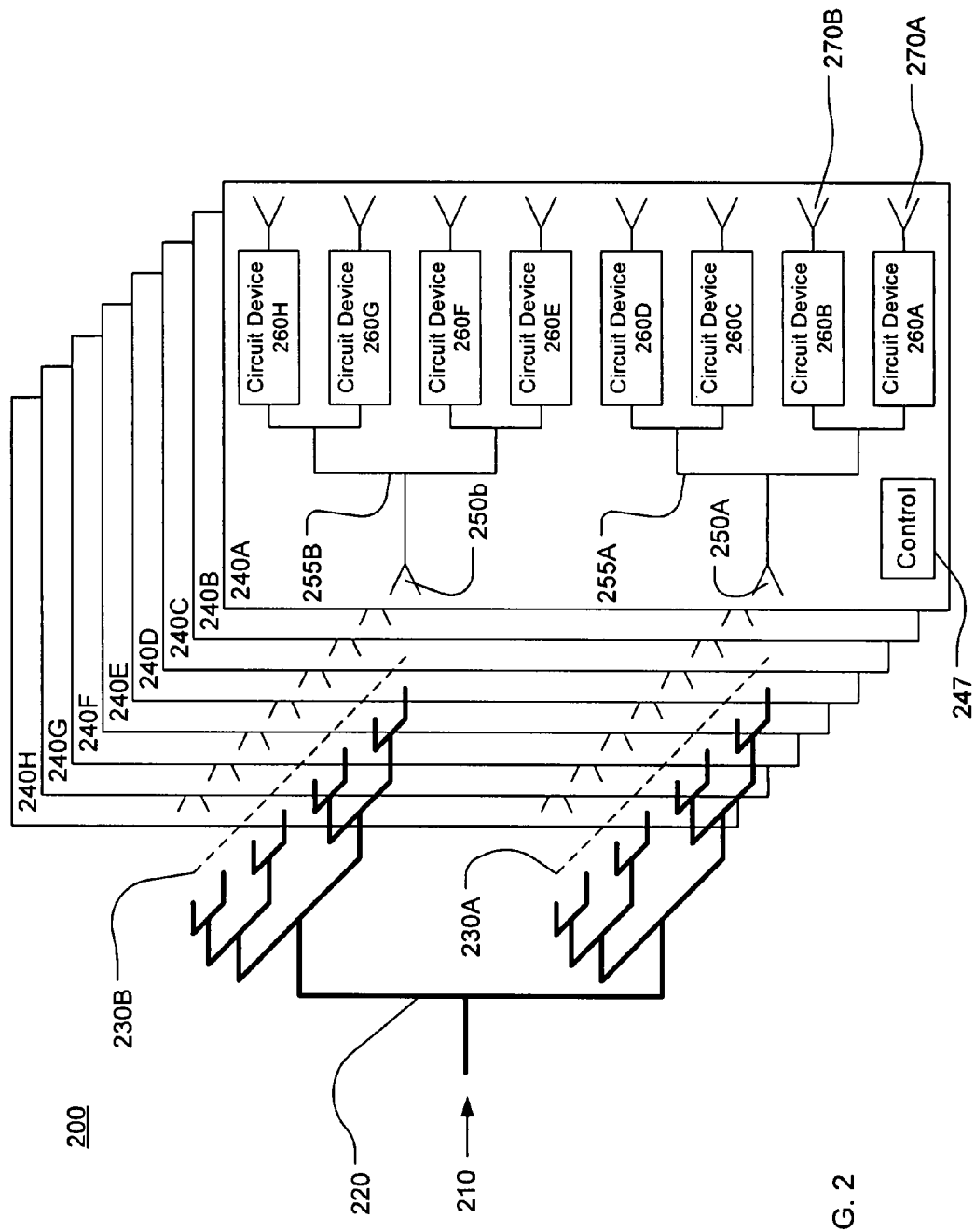
FIG. 2 is a block diagram of a power source module.

Referring now to the block diagram of FIG. 2, another exemplary power source module 200 may include a plurality of submodules 240A-H. Each submodule 240A-H may be comprised of a generally planar substrate supporting M circuit devices 260A-H. M is again equal to eight in the example of FIG. 2, but M may be less than or greater than eight.

Each circuit device 260A-H may have an input coupled to one of a first power divider 255A or a second power divider 255B. Each circuit device 260A-H may also have an output coupled to a radiating element. In this example, the inputs of circuit devices 260A-D may be coupled to outputs of first power divider 255A, and the inputs of circuit devices 260E-H may be coupled to outputs of second power divider 255B.

The power source module 200 may include a wavefront expander 220 to accept an MMW input wavefront 210 and to provide a first expanded MMW wavefront 230A and a second expanded MMW wavefront 230B. The MMW input wavefront 210 may be coupled from a waveguide or other transmission medium. The wavefront expander 220, represented in the block diagram of FIG. 1 as a 1:2:8 power divider, may include an asymmetric horn, a waveguide power divider or other power divider, lenses, curved or flat reflectors, and combinations of these and other elements. The expanded MMW wavefronts 230A and 230B may be plane waves or other wavefronts.

The first expanded MMW wavefront 230A may be coupled to a first receiving element 250A on each of the submodules 240A-H. Each receiving element may convert a portion of the energy of expanded MMW wavefront 230A into a signal coupled to the input of the first power divider 255A. Similarly, the second expanded MMW wavefront 230B may be coupled to a second receiving element 250B on each of the submodules 240A-H. Each receiving element may convert a portion of the energy of expanded MMW wavefront 230B into a signal coupled to the input of the second power divider 255B. The power dividers 255A and 255B may each be a stripline power divider or other power divider. Each of the power dividers 255A and 255B may have M/2 outputs, where M is the number of circuit devices 260A-H on a submodule. Each of the M/2 power divider outputs may be coupled to the input of a corresponding circuit device. Each circuit device may amplify or otherwise modify the input signal from the corresponding power divider output and provide an output signal to the corresponding radiating element. For example, receiving element 250A may provide an input signal power divider 255A, which provides a divided signal to the input of circuit device 260A. Circuit device 260A may, in turn, provide an output signal to radiating element 270A. Each radiating element may convert the output signal from the corresponding circuit element into a radiated wavefront (not shown). The radiated wavefronts from the plurality of radiating elements on the plurality of submodules may be spatially combined to provide an output wavefront (not shown) that differs from the expanded wavefront 130 in amplitude, direction, or some other property. The spatially combined output wavefront may be coupled into an output waveguide (not shown) or radiated into free space.

The example of FIG. 2 shows two receiving elements 205A and 250B coupled to power dividers 255A and 255B on each submodule. However, there may be K receiving elements on each submodule, where K may be an integer smaller than M. K may be a factor of M. The K receiving elements may be coupled to K inputs of a K:M power divider. The K:M power divider may consist of K separate power dividers, each of which has one input and M/K outputs. The wavefront expander 220 may provide a total of K separate expanded wavefronts, or one or more expanded wavefront that can be coupled to all K receiving elements on each of the submodules.

Figures 3A, 3B:
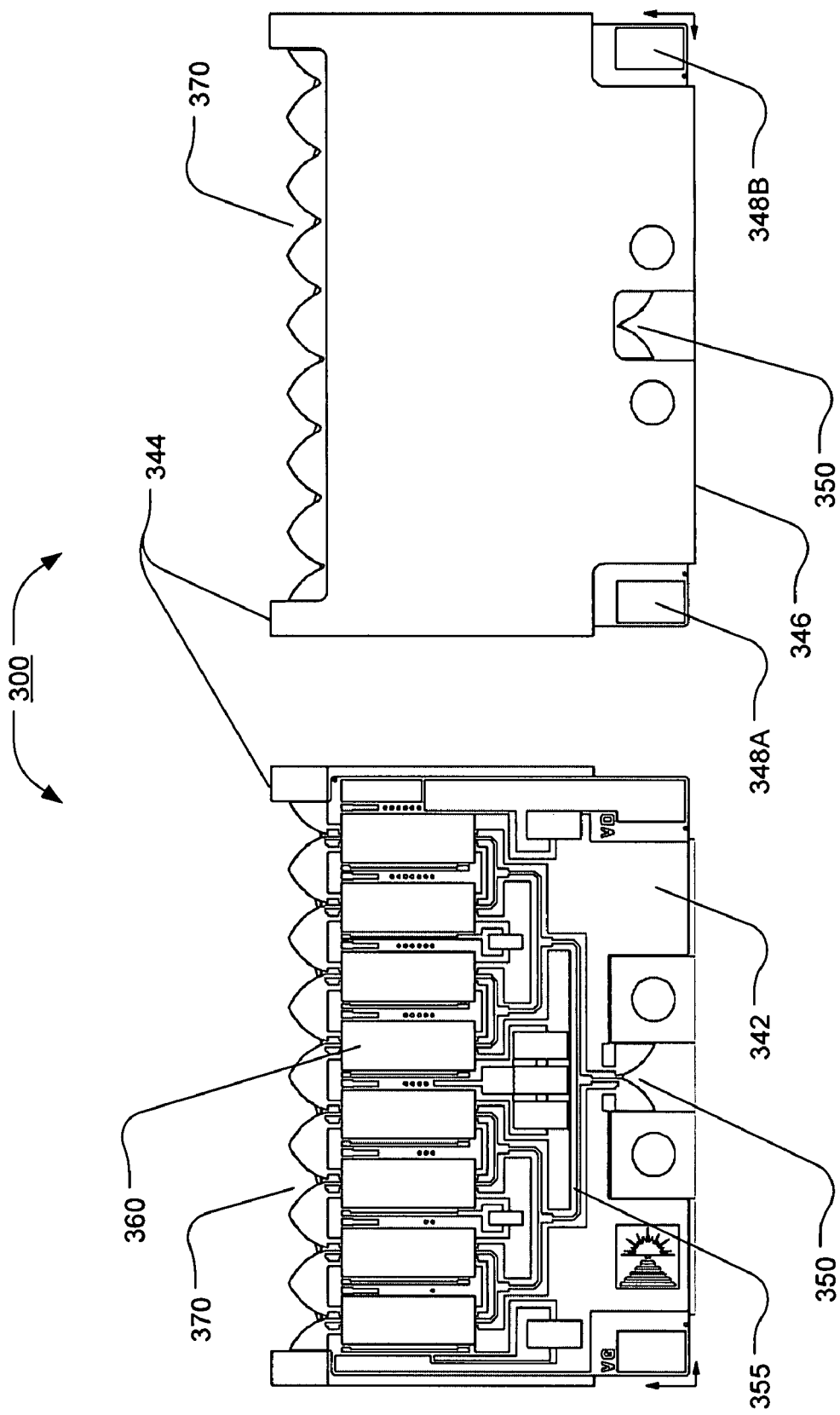
FIG. 3A is planar view of the front of a submodule.
FIG. 3B is a planar view of the back of a submodule.

FIG. 3A and FIG. 3B are front and back views of a submodule 300 which may be suitable for use in the power source module 100 of FIG. 1. Submodule 300 may include a generally rectangular dielectric substrate 342 having parallel front and back surfaces. The dielectric substrate 342 may be fabricated of alumina, beryllia, aluminum nitride, or other dielectric material suitable for use at the frequency of operation of the power source module 300. A plurality of circuit devices (eight in the example of FIG. 3A), of which circuit device 360 is typical, may be disposed on the front surface of substrate 342. A plurality of radiating elements, of which radiating element 370 is typical, may be disposed in a linear array along a first side of substrate 342 (the top side as seen in FIGS. 3A and 3B). Each radiating element may be coupled to an output of a corresponding circuit element. At least one receiving elements 350 may be disposed proximate a second side of substrate 342 opposed to the first side. The receiving element 350 may be coupled to an input of a power divider 355 may that be comprised of stripline conductors on the surface of substrate 342. The power divider 355 may have a plurality of outputs, each of which is coupled to an input of a corresponding circuit element, such as circuit element 360.

Submodule 300 may include a heat spreader 344. The heat spreader 344 may be comprised, for example, of a metal material such as aluminum or copper; a thermally conductive ceramic material such as alumina, beryllia, or aluminum nitride; or a composite material containing a thermally conductive filler such as pryolitic graphite. The heat spreader 344 may be the same material as the dielectric substrate 342 or another material. The heat spreader 344 may be bonded or otherwise thermally coupled to the dielectric substrate 342 with a heat conducting material. Suitable heat conducting materials may include a thermally-conductive grease, a thermally-conductive adhesive, a brazing material, or some other thermally-conductive material. Heat spreader 344 may be thermally coupled to substantially the entire back surface of substrate 342, except for the portions occupied by the radiating elements (such as radiating element 370), the at least one receiving element 350, and two or more contact regions 348A and 348B that may be used to connect a primary power supply to submodule 300. Contact regions 348A and 348B may include multiple electrical contacts (not shown in FIG. 3A or 3B) used to connect both power forms and control signals to submodule 300. The heat spreader 344 may have an interface surface 346 adapted to engage a heat exchanger. The at least one receiving element 370, the contact regions 348A and 348B, and the interface surface may all be disposed proximate to the second side of substrate 342.

Figure 4:
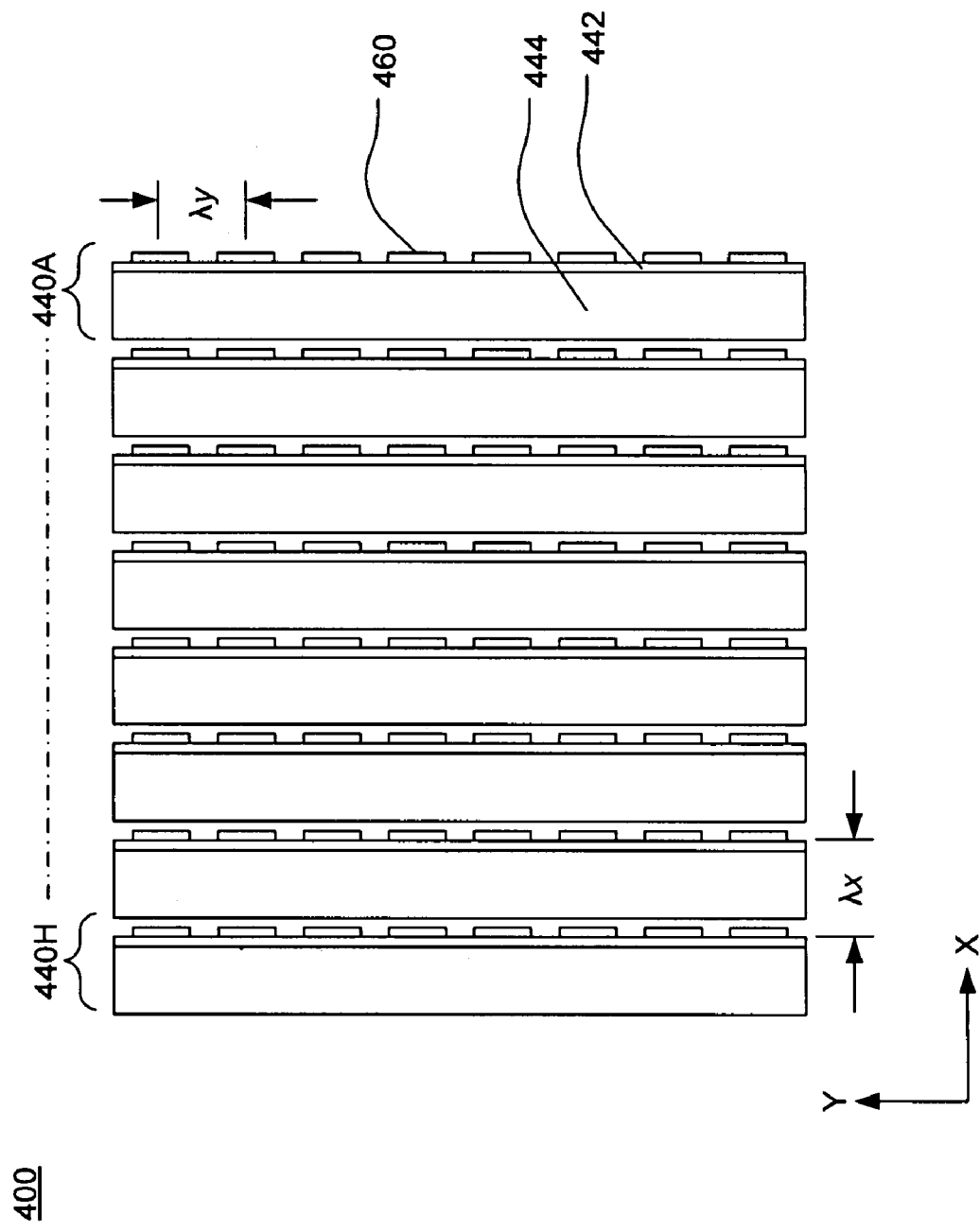
FIG. 4 is an end view of a power source module.

FIG. 4 is an end view of a power source module 400, which may be similar in architecture and function to power source module 100. A plurality of submodules 440A-H may be stacked in parallel. Each submodule may be similar to submodule 300 of FIG. 3. Each submodule may include a dielectric substrate 442 supporting a plurality of circuit devices, of which circuit device 460 is typical. Each submodule may also include a heat spreader 444 to remove heat from the circuit devices.

Each dielectric substrate 442 may support linear arrays of receiving elements and radiating elements coupled to and generally aligned with the circuit devices such as circuit device 460. The receiving elements and radiating elements may be constructed as metal films on one or both sides of the dielectric substrate 442 and are thus not visible in FIG. 4. The plurality of submodules may be stacked in parallel and appropriately spaced such that the plurality of radiating elements are located on a Cartesian X-Y grid, with the ends of the plurality of radiating elements lying in a common plane. The spacing between the columns of radiating elements (the center-to-center spacing of the submodules as shown in FIG. 4) may be $\lambda x$, where $\lambda$, is the frequency of operation of the power source module 400 and x is a constant typically between 0.5 and 1.0. The spacing between adjacent columns of elements may be exactly equal to the nominal spacing of $\lambda x$ or may deviate from the nominal spacing by a tolerance. The tolerance may be $\pm \lambda/10$ or some other tolerance. The constant x may be chosen such that the spacing between adjacent columns of radiating elements is from $0.5\lambda$ to $1.0\lambda$.

The spacing between the rows of radiating elements (the center-to-center spacing of the radiating elements on each submodule as shown in FIG. 4) may be $\lambda y$, where $\lambda$ is the frequency of operation of the power source module 400 and y is a constant typically between 0.5 and 1.0. The spacing between adjacent rows of elements may be exactly equal to the nominal spacing of $\lambda y$ or may deviate from the nominal spacing by a tolerance. The tolerance may be $\pm \lambda/10$ or some other tolerance. The constant y may be chosen such that the spacing between adjacent rows of radiating elements is from $0.5\lambda$ to $1.0\lambda$. The constants x and y may be equal or unequal.

Figure 5:
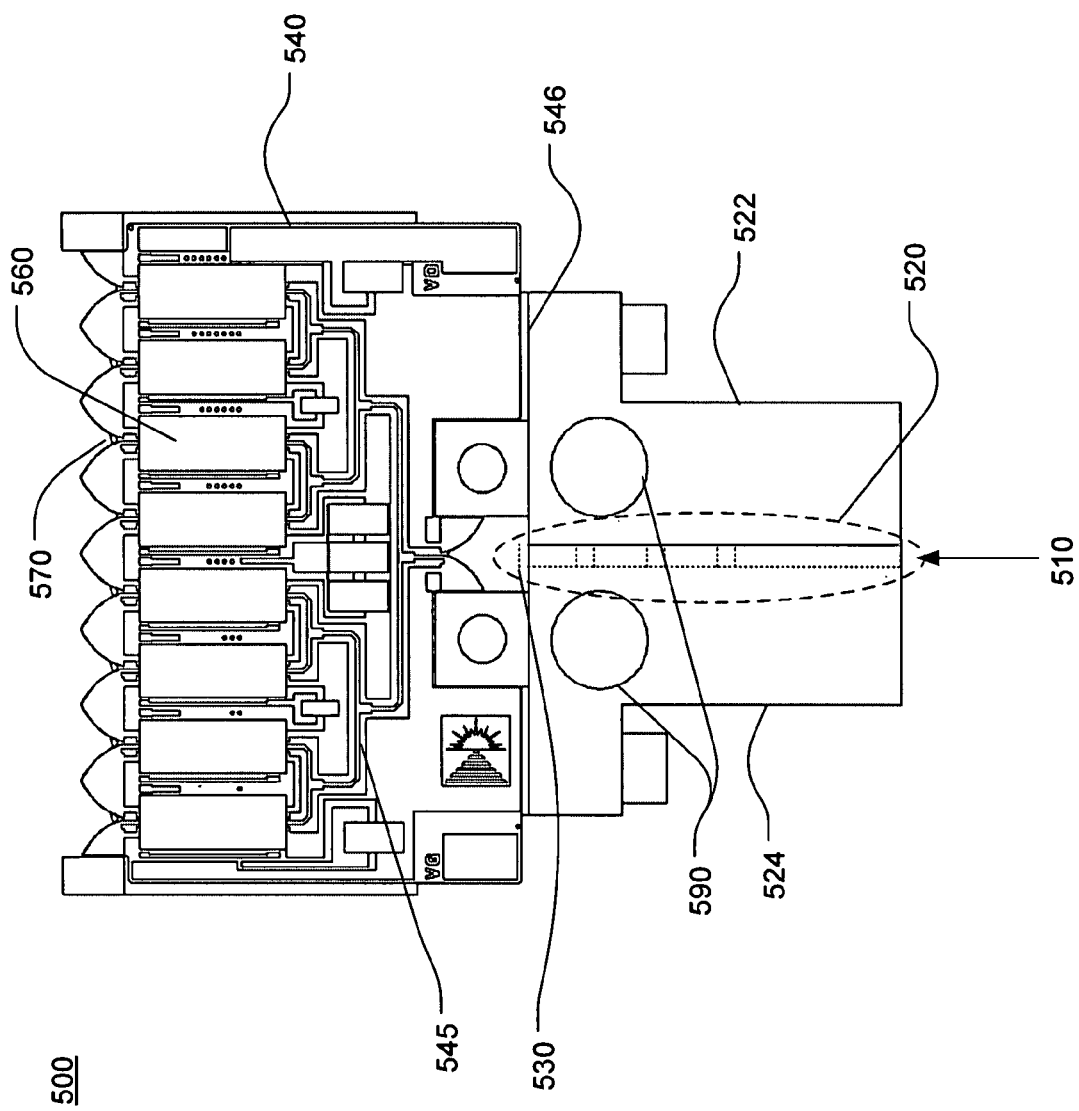
FIG. 5 is a side view of a power source module.

FIG. 5 is a side view of a power source module 500, which may be similar to the power source module 400 of FIG. 4. The power source module 500 may contain a plurality of submodules stacked in parallel, of which only submodule 540 is visible. Submodule 540 may include a plurality of circuit devices, of which circuit device 560 is representative. Each circuit device may have an input coupled to power divider 545 and an output coupled to a radiating element such as radiating element 570.

Metal structures 522 and 524 may collectively form a combined heat sink and wavefront expander. The combined heat sink and wavefront expander 522/524 may accept an input wavefront 510 from a waveguide or other transmission medium and expand the input wavefront along the axis normal to the plane of FIG. 5 to form an expanded wavefront 530. The input wavefront 510 may be expanded by means of a waveguide power divider, a uniaxial horn, or other structure embedded in the metal structures 522 and 524 in the region indicated by dashed line 520. The expanded wavefront 530 may be coupled to the inputs of a plurality of power dividers (of which only power divider 545 is visible) disposed on the plurality of submodules.

The combined heat sink and wavefront expander 522/524 may function as a heat exchanger to remove heat generated in the submodules such as submodule 540. Heat generated in the circuit devices, such as circuit device 560, on the plurality of submodules may be coupled to heat spreaders (not visible) incorporated in the submodules, as previously described. The submodule heat spreaders may, in turn, be thermally coupled to the combined heat sink and wavefront expander 522/524 at an interface surface 546. The heat coupled from the submodule heat spreaders may be conducted through the metal structures 522 and 524, and then transferred to a coolant fluid flowing through the one or more heat exchanger coolant channels 590. The coolant fluid may be, for example, a gas or a liquid. While the heat exchanger coolant channels 590 are shown as simple circular openings in FIG. 5, the coolant channels may include fins, vanes, posts and other structures. Such structures may be incorporated to increase the surface area exposed to the flowing coolant and/or to increase the turbulence of the coolant to improve the efficiency of heat transfer from the metal structures to the coolant. Each metal structure 522 and 524 may have multiple coolant channels, which may be disposed at any location where the thickness of the metal structure is sufficient.

Figure 6:
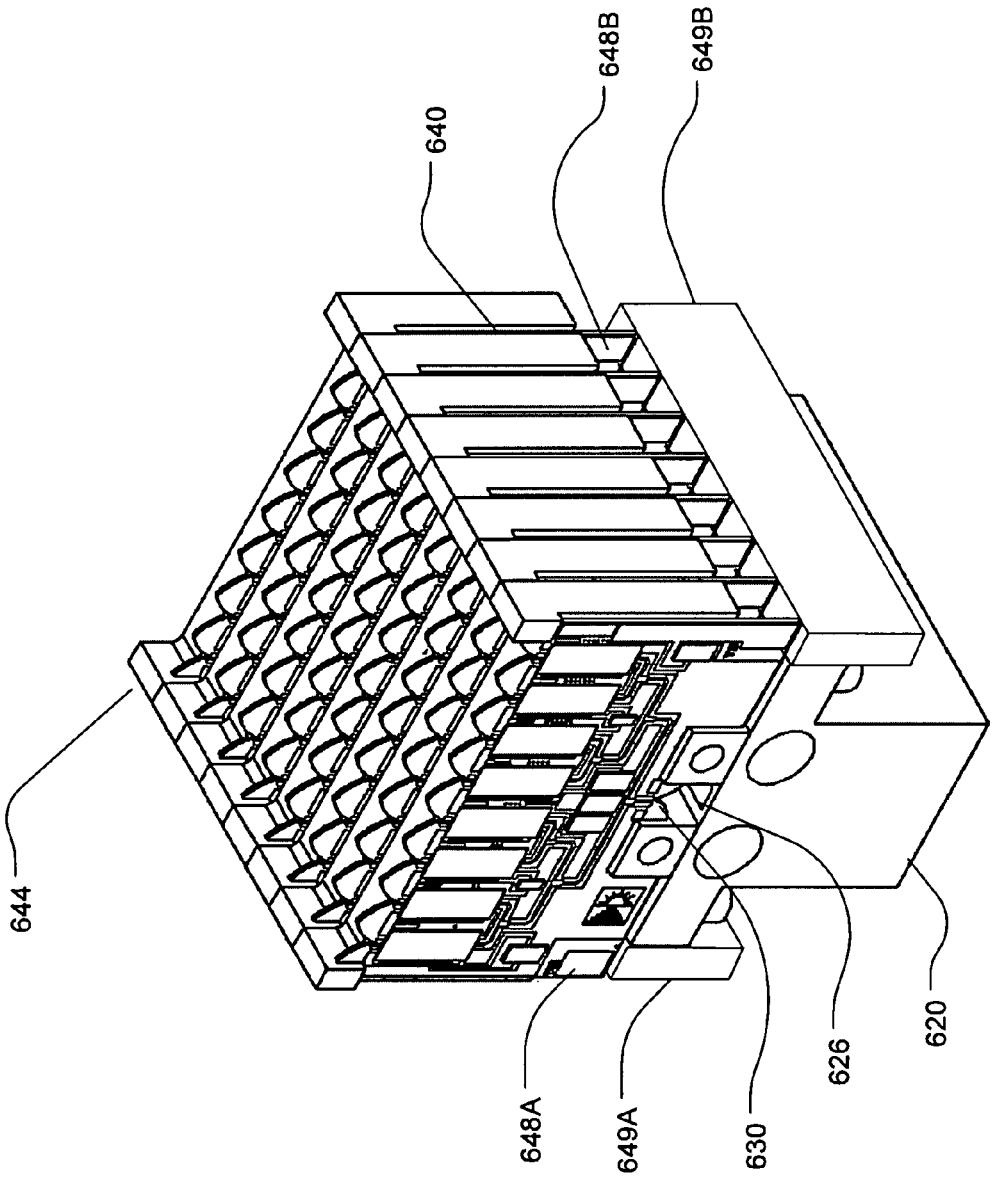
FIG. 6 is a perspective view of a power source module.

FIG. 6 is a perspective view of a power source module 600, which may be similar to power source module 400 and/or power source module 500. Power source module 600 may include a stack of a plurality of submodules, such as submodules 640. Each of the submodules may include a heat spreader, such as heat spreader 644, which may be a component of submodule 640. The power source module 600 may include a combined wavefront expander and heat exchanger 620. The combined wavefront expander and heat exchanger 620 may have an exit port 626 in proximity to the receiving elements on each of the submodules, of which only receiving element 630 is visible. The exit port 626 may be aligned with, but spaced away from, the receiving elements such as receiving element 630.

Each submodule may have accessible contact regions 648A and 648B for the coupling of DC power and other signals to each submodule. The DC power and other signals may be coupled from interface units 649A and 649B. Each of the interface units 649a and 649B may be a circuit card, an electrical connector, a wiring harness, or other electric interface mechanism. The DC power and other signals may be coupled between the interface units 649A and 649B and each submodule by means of wires (not shown) attached to the contact regions 648A/B, electrical connectors (not shown) that engage the contact regions 648A/B, or other electrical coupling method. Each submodule may include electrical connectors (not shown) disposed at the contact regions 649A and 649B.

Figure 7:
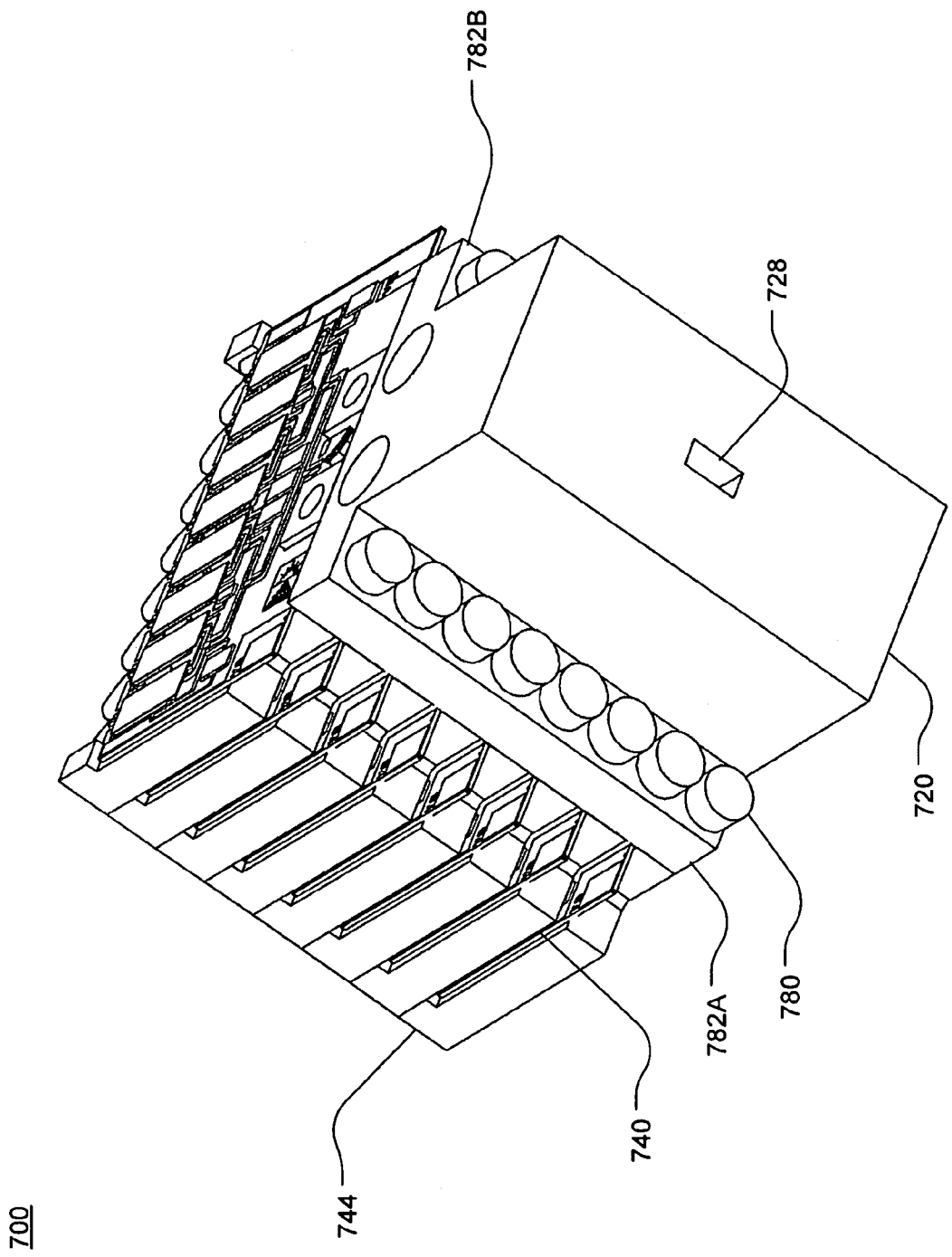
FIG. 7 is a another perspective view of a power source module.

FIG. 7 is a perspective view of a power source module 700, which may be similar to power source module 600. Power source module 700 may include a stack of a plurality of submodules, such as submodule 740. Each of the plurality of submodules may include a heat spreader, such as heat spreader 744, which is a portion of submodule 740. The power source module 600 may include a combined wavefront expander and heat exchanger 720. The combined wavefront expander and heat exchanger 720 may have an input port 728. The combined wavefront expander and heat exchanger 720 may include ribs 782A and 782B that are thermally coupled to the heat spreaders of the submodules, such as heat spreader 744. The submodules may be supported and urged into thermal contact with the combined wavefront expander and heat exchanger 720 by screws, such as screw 780, that pass through the ribs 782A and 782B and engage with threaded holes in the heat spreaders, such as heat spreader 744.

Figure 8:
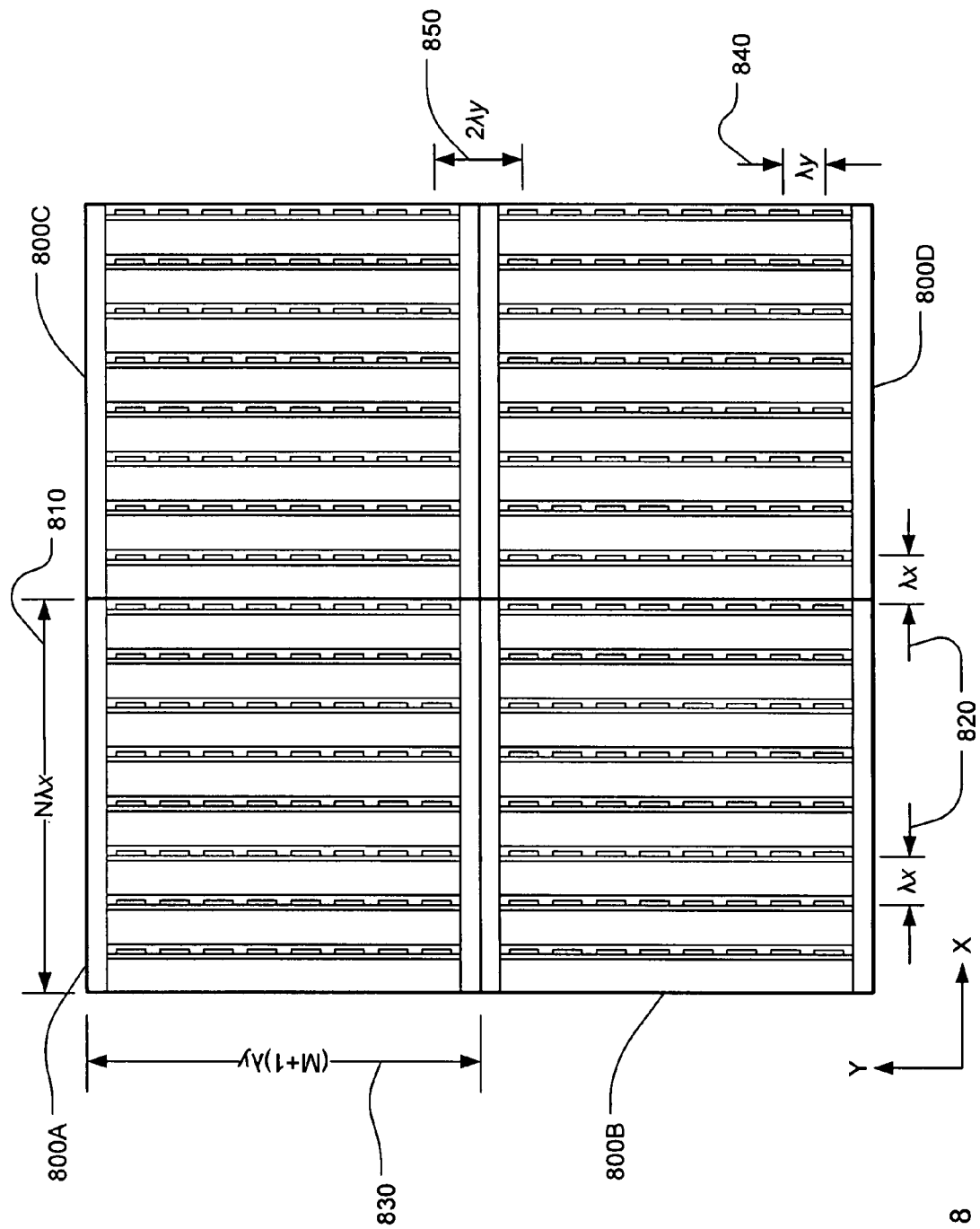
FIG. 8 is an end view of a modular power source using plural power source modules.

FIG. 8 is an end view of a modular MMW power source comprised of four power source modules 800A-D, which may be similar to previously described power source modules 400, 600 and 700. The four modules are juxtaposed to form a 2N×2M Cartesian array of radiating elements, where N is the number of submodules per module and M is the number of radiating elements per submodule. The width 810 of each module, measured normal to the planes of the submodules, may be essentially equal to $N\lambda x$, where $\lambda$ is the operating frequency of the power source and x is a constant typically between 0.5 and 1.0. In this context, "essentially equal to" means exactly equal to the nominal value of $N\lambda x$ or deviating from the nominal value by no more than an acceptable tolerance, which may be $\pm\lambda/10$. In the event that the width of each module is exactly equal to $N\lambda x$, the modules may be directly abutted to maintain uniform spacing 820 essentially equal to $\lambda x$ between columns of radiating elements. In the event that the width of each module is slightly less than $N\lambda x$, shims or another spacing mechanism may be used to establish the correct spacing between adjacent modules.

The height 830 of each submodule may be essentially equal to $M\lambda y$. To allow room for the metal structures that conduct heat away from the submodules, the height 830 of each submodule may be essentially equal to $(M+1)\lambda y$. In this case the spacing 840 between rows of radiating elements may be essentially equal to $\lambda y$ except at the boundaries between adjacent submodules, where the spacing 850 between radiating elements may be essentially equal to $2\lambda y$. Effectively, a single row of radiating elements may be missing at the boundary between adjacent modules.

As used in the preceding paragraphs, height and width, and row and column, are relative terms descriptive of the modular power source as shown in FIG. 8. These terms do not imply any absolute orientation of the modular power source.

CLOSING COMMENTS

The foregoing is merely illustrative and not limiting, having been presented by way of example only. Although examples have been shown and described, it will be apparent to those having ordinary skill in the art that changes, modifications, and/or alterations may be made.

Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

For means-plus-function limitations recited in the claims, the means are not intended to be limited to the means disclosed herein for performing the recited function, but are intended to cover in scope any means, known now or later developed, for performing the recited function.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of" respectively, are closed or semi-closed transitional phrases with respect to claims.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

It is claimed:

1. A millimeter wave power source module, comprising
N submodules, where N is an integer greater than 1, each submodule comprising
   M circuit devices, where M is an integer greater than 1, each circuit device having an input and an output
   M radiating elements disposed in a linear array along a first side of each submodule, each radiating element coupled to the output of a corresponding one of the M circuit devices
   K receiving elements, where K is an integer less than M, disposed along a second side of each submodule, the second side opposed to the first side
   a K:M power divider having K input ports and M output ports, each input port coupled to a corresponding receiving element, and each output port coupled to the input of a corresponding one of the M circuit devices
   a heat spreader for removing heat from the M circuit devices
a combination RF feed network and heat sink disposed adjacent to the second sides of the N submodules and thermally coupled to the heat spreaders of the N submodules along at least a portion of the second side of each submodule, the combination RF feed network and heat sink comprising
   a wavefront expander to receive an RF input wavefront, to expand the RF input wavefront along at least one axis, and to direct the expanded wavefront to the receiving elements on each of the N submodules.

2. The millimeter wave power source module of claim 1, wherein K, M and N are powers of two.

3. The millimeter wave power source module of claim 1, wherein M and N are equal.

4. The millimeter wave power source module of claim 1, wherein the N submodules are stacked in parallel to provide a planar array of N×M radiating elements.

5. The millimeter wave power source module of claim 4, wherein the N×M radiating elements are disposed on a rectilinear X-Y grid with the spacing between adjacent pairs of radiating elements substantially equal to $\lambda x$ on the X axis and substantially equal to $\lambda y$ on the Y axes, where $\lambda$, is an operating wavelength of the millimeter wave power source module and x and y are constants selected in the range from 0.5 to 1.0.

6. The millimeter wave power source module of claim 5, wherein the overall dimensions of the millimeter wave power source module, measured along the X-Y grid are essentially equal to $N\lambda x$ by $M\lambda y$ or $N\lambda x$ by $(M+1)\lambda y$.

7. The millimeter wave power source module of claim 4, wherein the module is adapted to be juxtaposed with a plurality of similar modules to provide a modular array, wherein
the radiating elements of the modular array are disposed on a rectilinear X-Y grid with the spacing between adjacent grid points substantially equal to λx on the X axis and substantially equal to λy on the Y axes, where λ is an operating wavelength of the millimeter wave power source module and x and y are constants selected in the range from 0.5 to 1.0, and
wherein no more than one row or column of radiating elements is absent at the boundary between adjacent juxtaposed modules.

8. The millimeter wave power source module of claim 1, wherein each circuit device comprises at least one of an amplifier, an amplitude adjuster, and a phase shifter.

9. The millimeter wave power source module of claim 1, wherein each receiving element and each radiating element comprises a Vivaldi antenna element.

10. The millimeter wave power source module of claim 1, wherein each K:M power divider comprises a stripline power divider.

11. The millimeter wave power source module of claim 1, wherein the combination RF feed network and heat sink couples a plane wave of millimeter wave radiation to the receiving elements on each of the N submodules.

12. The millimeter wave power source module of claim 1, the combination RF feed network and heat sink further comprising one of a waveguide power divider and a asymmetrical horn embedded in a metal block.

13. The millimeter wave power source module of claim 12, wherein
the metal block is thermally coupled to the heat spreaders of each of the N submodules
the metal block having passages adapted to receive a fluid coolant.

14. A millimeter wave power source array, comprising
a plurality of juxtaposed modules, wherein each module further comprises
N submodules, where N is an integer greater than 1, each submodule comprising
M circuit devices, where M is an integer greater than 1, each circuit device having an input and an output
M radiating elements disposed in a linear array along a first side of each module, each radiating element coupled to the output of a corresponding one of the M circuit devices
K receiving elements, where K is an integer less than M, disposed along a second side of each submodule, the second side opposed to the first side
a K:M power divider having K input ports and M output ports, each input port coupled to a corresponding receiving element, and each output port coupled to the input of a corresponding one of the M circuit devices
a heat spreader for removing heat from the M circuit devices
a combination RF feed network and heat sink disposed adjacent to the second sides of the N submodules and thermally coupled to the heat spreaders of the N submodules along at least a portion of the second side of each submodule, the combination RF feed network and heat sink comprising
a wavefront expander to receive an RF input wave, to expand the RF input wave along at least one axis, and to direct the expanded input wave to the receiving elements of the N submodules.

15. The millimeter wave power source array of claim 14, wherein
the radiating elements of the millimeter wave power source array are disposed on a rectilinear X-Y grid with the spacing between adjacent grid points substantially equal to λx on the X axis and substantially equal to λy on the Y axes, where λ, is an operating wavelength of the millimeter wave power source module and x and y are constants selected in the range from 0.5 to 1.0
wherein no more than one row or column of radiating elements is absent at the boundary between adjacent juxtaposed modules.

16. A millimeter wave power source module, comprising
N submodules, where N is an integer greater than 1, each submodule comprising
a linear array of M radiating elements disposed along a first side of each submodule
at least one receiving element disposed along a second side of each submodule opposed to the first side
a heat spreader for removing heat
a combination RF feed network and heat sink disposed adjacent to the second sides of the N submodules comprising
a wavefront expander to receive an RF input wavefront, to expand the RF input wavefront along at least one axis, and to couple the expanded wavefront to the at least one receiving element on each of the N submodules
a heat exchanger thermally coupled to the heat spreaders along at least a portion of the second side of each of the N submodules.

17. The millimeter wave power source module of claim 16, wherein the N submodules are stacked in parallel to provide a planar array of N×M radiating elements.

18. The millimeter wave power source module of claim 17, wherein the millimeter wave power source module is adapted to be juxtaposed with a plurality of similar modules to provide a modular array, wherein
the radiating elements of the modular array are disposed on a rectilinear X-Y grid with the spacing between adjacent grid points substantially equal to λx on the X axis and substantially equal to λy on the Y axes, where λ is an operating wavelength of the millimeter wave power source module and x and y are constants selected in the range from 0.5 to 1.0
no more than one row or column of radiating elements is absent at the boundary between adjacent juxtaposed modules.

19. A millimeter wave power source array, comprising
a plurality of juxtaposed modules, wherein each module further comprises
N submodules, where N is an integer greater than 1, each submodule comprising
a linear array of M radiating elements disposed along a first side of each submodule
at least one receiving element disposed along a second side of each submodule opposed to the first side
a heat spreader for removing heat
a combination RF feed network and heat sink disposed adjacent to the second sides of the N submodules comprising
a wavefront expander to receive an RF input wavefront, to expand the RF input wavefront along at least one axis, and to couple the expanded wavefront to the at least one receiving element on each of the N submodules a heat exchanger thermally coupled to the heat spreader along at least a portion of the second side of each of the N submodules.

20. The millimeter wave power source array of claim 19, wherein the radiating elements of the millimeter wave power source array are disposed on a rectilinear X-Y grid with the spacing between adjacent grid points substantially equal to $\lambda x$ on the X axis and substantially equal to $\lambda y$ on the Y axes, where $\lambda$ is an operating wavelength of the millimeter wave power source module and x and y are constants selected in the range from 0.5 to 1.0 no more than one row or column of radiating elements is absent at the boundary between adjacent juxtaposed modules.

* * * * *